US012811597B2

(12) United States Patent
Landini et al.

(10) Patent No.: US 12,811,597 B2
(45) Date of Patent: Nov. 24, 2026

(54) DIGITAL CONTROL LOOP OF SENSOR SUPPLY

(71) Applicant: STMicroelectronics International N.V., Geneva (CH)

(72) Inventors: Matteo Landini, Corbetta (IT); Marta Cantarini, Milan (IT)

(73) Assignee: STMicroelectronics International N.V., Geneva (CH)

( * ) Notice: Subject to any disclaimer, the term of this patent is extended or adjusted under 35 U.S.C. 154(b) by 129 days.

(21) Appl. No.: 18/404,472

(22) Filed: Jan. 4, 2024

(65) Prior Publication Data

US 2025/0226834 A1 Jul. 10, 2025

(51) Int. Cl.
*H03M 1/12* (2006.01)
*H03M 1/00* (2006.01)
*H03M 1/46* (2006.01)

(52) U.S. Cl.
CPC ........... *H03M 1/125* (2013.01); *H03M 1/002* (2013.01); *H03M 1/46* (2013.01)

(58) Field of Classification Search
CPC ............ H03M 1/00; H03M 1/12; H03M 1/46; H03M 1/68; H03M 1/742; H03M 1/089; H03M 1/1028; H03M 1/183; H03M 1/365; H03M 1/502; H03M 1/745; H03M 1/785; H03M 3/424; H03M 1/002; H03M 1/0607; H03M 1/0619; H03M 1/0621; H03M 1/0626; H03M 1/0641; H03M 1/0682; H03M 1/0836; H03M 1/1057; H03M 1/1245; H03M 1/144; H03M 1/146; H03M 1/162; H03M 1/447; H03M 1/468; H03M 1/48; H03M 1/50; H03M 1/66; H03M 1/664; H03M 1/668; H03M 1/687; H03M 1/74; H03M 1/747; H03M 3/332; H03M 3/37; H03M 3/43; H03M 3/454; H03M 7/10; H03M 9/00
USPC ................................ 341/118, 120, 143, 155
See application file for complete search history.

(56) References Cited

U.S. PATENT DOCUMENTS 5,990,817 A * 11/1999 Belin .................. H03M 1/1028 341/127
6,075,478 A * 6/2000 Abe ...................... H03M 1/002 341/155
6,750,797 B1 * 6/2004 Gunther .................... G05F 1/56 341/144
7,489,181 B2 * 2/2009 Pastorina ................ G05F 3/262 327/530
7,656,127 B1 * 2/2010 Shutt ..................... H01M 10/46 320/134
9,843,338 B1 * 12/2017 Newlin .................. H03M 11/24
9,882,575 B1 * 1/2018 Li ....................... H03M 1/1023
9,966,781 B2 * 5/2018 Wei ........................... H02J 7/00
2005/0093619 A1 * 5/2005 Naffziger ................ G05F 3/262 327/543

(Continued)

OTHER PUBLICATIONS

Anonymous: "Low-dropout regulator—Wikipedia", Jan. 28, 2023, pp. 1-6, XP093277963.

(Continued)

*Primary Examiner* — Linh V Nguyen
(74) *Attorney, Agent, or Firm* — Alston & Bird LLP

(57) ABSTRACT

Various examples in accordance with the present disclosure provide example methods, systems, and apparatuses for digital control loop of sensor supply.

16 Claims, 5 Drawing Sheets

(56) References Cited

U.S. PATENT DOCUMENTS

| | | | | |
|---|---|---|---|---|
| 2007/0182391 | A1 | 8/2007 | Chapuis et al. | |
| 2013/0043908 | A1 | 2/2013 | Hammerschmidt | |
| 2014/0028086 | A1 | 1/2014 | Hammerschmidt et al. | |
| 2014/0358377 | A1 | 12/2014 | Hammerschmidt et al. | |
| 2014/0379202 | A1 | 12/2014 | Hammerschmidt | |
| 2017/0083033 | A1* | 3/2017 | Park | G05F 1/59 |
| 2018/0337585 | A1 | 11/2018 | Xu et al. | |
| 2020/0136631 | A1* | 4/2020 | Naru | H03M 1/468 |
| 2022/0294343 | A1* | 9/2022 | Peretz | H02M 1/0003 |
| 2022/0306457 | A1* | 9/2022 | Straeussnigg | H04R 19/04 |
| 2023/0223947 | A1* | 7/2023 | Trivedi | H03M 1/785<br>341/120 |

OTHER PUBLICATIONS

Extended European Search Report for Application No. 24215909.3, dated May 28, 2025, 12 pages.

* cited by examiner

DIGITAL CONTROL LOOP OF SENSOR SUPPLY

FIELD OF THE INVENTION

Example embodiments of the present disclosure relate to sensor supply and, more particularly, to digital control loop of sensor supply, particularly suited for distributed system interface (DSI3), wheel speed sensor (WSS), and peripheral sensor interface (PSI5) compliant systems.

BACKGROUND

Applicant has identified many technical challenges and difficulties associated with sensor supply. Through applied effort, ingenuity, and innovation, Applicant has solved many of these identified problems by developing the embodiments of the present disclosure, which are described in detail below.

BRIEF SUMMARY

Various embodiments described herein relate to sensor supply and, more particularly, to digital control loop of sensor supply, particularly suited for DSI3, WSS, and PSI5 compliant systems.

In accordance with one aspect of the present disclosure, a digital control loop for sensor supply is provided. In some embodiments, the digital control loop sensor includes a digital control loop for sensor supply comprising an analog-to-digital module configured to receive an analog input voltage, and generate a digital signal corresponding to the analog input voltage; a voltage drop module coupled to the analog-to-digital module, the voltage drop module configured to receive one or more of a fixed voltage drop or a modulation voltage drop, and generate a reference voltage control signal based on one or more of the fixed voltage drop or the modulation voltage drop; a digital-to-analog module coupled to the voltage drop module, the digital-to-analog module configured to generate a reference voltage based on the reference voltage control signal; and a voltage regulator module coupled to the digital-to-analog module and at least one sensor, the voltage regulator module configured to compare the reference voltage to a sensed voltage at an output node coupled to the at least one sensor, and control a supply voltage for the sensor based on the comparison of the reference voltage to the sensed voltage.

In some embodiments may be configured to generate the reference voltage control signal by subtracting the fixed voltage drop from the digital signal corresponding to the analog input voltage, wherein the reference voltage control signal has a fixed value.

In some embodiments, the voltage drop module is configured to generate the reference voltage control signal by applying the modulation voltage drop to the digital signal during a forward communication configured to transmit a message to the at least one sensor.

In some embodiments, the reference voltage control signal comprises a voltage waveform, wherein the voltage drop module is further configured to define a shape profile of the voltage waveform.

In some embodiments, the analog-to-digital module comprises an analog-to-digital converter (ADC) configured to process the analog input voltage; and a digital filter configured to filter an output of the ADC to generate the digital signal corresponding to the analog input voltage.

In some embodiments, the digital filter comprises a low pass filter.

In some embodiments, the digital-to-analog module comprises a digital-to-analog converter (DAC) configured to process the reference control signal to generate the reference voltage.

In some embodiments, the voltage regulator module comprises a differential amplifier having a first input terminal configured to receive the reference voltage and a second input terminal configured to receive the sensed voltage; a power transistor having a gate terminal coupled to an output terminal of the differential amplifier; and a voltage divider coupled to the power transistor and the second input terminal of the differential amplifier.

In some embodiments, the voltage divider is configured to generate the sensed voltage.

In some embodiments, a drain terminal of the power transistor is coupled to the output node and the voltage divider.

In some embodiments, the voltage divider is configured to scale down a voltage at the output node to a level equal to the reference voltage.

In some embodiments, the analog input voltage is received from a voltage source associated with a vehicle.

In some embodiments, the fixed voltage drop is configurable.

In accordance with another aspect of the present disclosure, a transceiver is provided. In some embodiments, the transceiver comprises a digital control loop for sensor supply comprising an analog-to-digital module configured to receive an analog input voltage, and generate a digital signal corresponding to the analog input voltage; a voltage drop module coupled to the analog-to-digital module, the voltage drop module configured to receive one or more of a fixed voltage drop or a modulation voltage drop, and generate a reference voltage control signal based on one or more of the fixed voltage drop or the modulation voltage drop; a digital-to-analog module coupled to the voltage drop module, the digital-to-analog module configured to generate a reference voltage based on the reference voltage control signal; and a voltage regulator module coupled to the digital-to-analog module and at least one sensor, the voltage regulator module configured to compare the reference voltage to a sensed voltage at an output node coupled to the at least one sensor, and control a supply voltage for the sensor based on the comparison of the reference voltage to the sensed voltage.

In some embodiments, the voltage drop module of the digital control loop is configured to generate the reference voltage control signal by subtracting the fixed voltage drop from the digital signal corresponding to the analog input voltage, wherein the reference voltage control signal has a fixed value.

In some embodiments, the voltage drop module of the digital control loop is configured to generate the reference voltage control signal by applying the modulation voltage drop to the digital signal during a forward communication configured to transmit a message to the at least one sensor.

In some embodiments, the reference voltage control signal comprises a voltage waveform, wherein the voltage drop module is further configured to define a shape profile of the voltage waveform.

In some embodiments, the analog-to-digital module of the digital control loop comprises an analog-to-digital converter (ADC) configured to process the analog input voltage; and a digital filter configured to filter an output of the ADC to generate the digital signal corresponding to the analog input voltage.

In some embodiments, the digital filter of the digital control loop comprises a low pass filter.

In accordance with another aspect of the present disclosure, a method for controlling a voltage supply for a sensor is provided. In some embodiments, the method comprises receiving an analog input voltage; generating a digital signal corresponding to the analog input voltage; generating a reference voltage control signal by applying a fixed voltage drop to the digital signal; generating, based on the reference voltage control signal, a reference voltage signal; generating a control voltage based on comparing the reference voltage signal to a sensed voltage, wherein the control voltage is configured to control supply voltage for the sensor.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
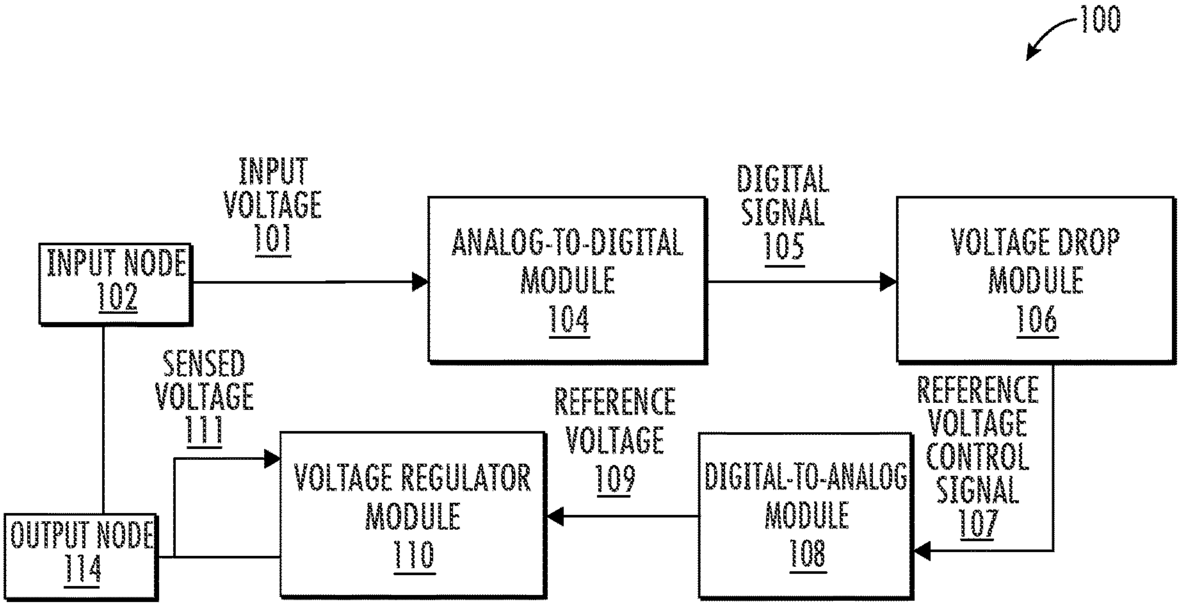
FIG. 1 provides an example block diagram of a digital control loop for sensor supply in accordance with at least one embodiment.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

Terms such as "computing," "determining," "generating," and/or similar words are used herein interchangeably to refer to the creation, modification, or identification of data. Further, "based on," "based on in part on," "based at least on," "based upon," and/or similar words are used herein interchangeably in an open-ended manner such that they do not indicate being based only on or based solely on the referenced element or elements unless so indicated. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

As used herein, the term "or" is used in both the alternative and conjunctive sense, unless otherwise indicated. The terms "illustrative" and "example" are used to be examples with no indication of quality level. Terms such as "computing," "determining," "generating," and/or similar words are used herein interchangeably to refer to the creation, modification, or identification of data. Further, "based on," "based on in part on," "based at least on," "based upon," and/or similar words are used herein interchangeably in an open-ended manner such that they do not indicate being based only on or based solely on the referenced element or elements unless so indicated. Like numbers refer to like elements throughout.

Vehicles often include a number of different sensors (e.g., braking sensors, airbag sensors, seat belt sensors, acceleration sensors and/or the like). In many applications, these sensors are placed at the periphery of the vehicle. For example, many of these sensors are remote sensor A sensor interface can be used to facilitate supply of voltage to the sensors and/or communication between the sensors and an engine control unit (ECU) of the vehicle. For example, a sensor interface can be leveraged to supply voltage to the sensor(s) of the vehicle and to transmit messages between the sensor(s) and the ECU. In various applications, the number of wires connecting an ECU to a sensor is limited due to cost and/or other reasons. Conventional wiring interface standards/communication standards such as PSI5, DSI3, and WSS standards, for example, limit the number of wires connecting an ECU to a sensor to two wires. Typical sensors, for example, may be 2-wire sensors for systems implementing such wiring interface standards/communication standards.

A transceiver in automotive application of sensors (e.g., sensors used in braking systems, airbag systems, seat belt systems, and/or the like) implementing such standards (e.g., DSI3, PS15, and WSS) and configured to supply voltage to the sensor(s) must provide such supply voltage using a limited number of wires. A limited number of wires may be allowed to be used to provide the supply voltage to the sensor(s) and also to communicate with the sensors (e.g. exchange messages between the sensor(s) and ECU). For example, the supply line for providing the supply voltage may also be used for forward communication from the transceiver to the sensor. Thus, the transceiver must finely control the voltage at the sensor supply line. Moreover, the sensor(s) generally require stable voltage to, for example, limit and/or avoid variation in the current sunk by the sensor(s)—which can impact performance (e.g., message decoding error, poor electromagnetic compatibility (EMC) performance, etc.).

Conventional solutions include several deficiencies including, for example, low configurability; fixed regulation voltage relative to ground which leads to higher power dissipation; high susceptibility to noise on the power supply, and difficulties managing voltage transition between DC voltage value and beginning/end of communication pulse which causes higher emissions. In various systems, in particular automotive systems, there is a need for low cost, highly robust, and moderate speed interconnection limited to two wires (or three wires) that has good EMC performance, reduced/low power dissipation and a failsafe.

Embodiments of the present disclosure address the above deficiencies. Example embodiments of the present disclosure provide a digital control loop for sensor supply having improved performance and particularly suited for DSI3, PSI5, and WSS compliant systems. In various embodiments, the digital control loop is embodied within a transceiver or otherwise form at least a portion of a transceiver, where the transceiver is configured to function as a sensor interface. In various embodiments, the digital control loop is implemented as an integrated circuit. (IC). For example, the digital control loop may be embodied within a transceiver IC.

In various embodiments, the digital control loop for sensor supply is configured to generate a stable supply voltage (e.g., $V_{HIGH}$ in DSI3) for sensors starting from the input voltage provided by an input voltage source. For example, the digital control loop for sensor supply may be configured to generate a stable supply voltage for remote sensors starting from the input voltage provided by an input voltage source, such as a battery and/or the like. In various embodiments, the digital control loop for sensor supply is configured to supply regulated voltage to one or more sensors and provide modulated voltage to the one or more sensors. For example, various embodiments of the present disclosure relate to a digital control loop configured to supply regulated voltage to one or more sensors and also modulate the regulated voltage for forward communication (e.g., to transmit messages to the one or more sensors).

Example embodiments provide several technical improvements/advantages. Example embodiments provide a digital control loop configured to generate a configurable supply voltage relative to the number of sensors connected—in tracking with the input voltage. Example embodiments provide a stable voltage at the sensor supply, which in turn optimizes the internal power dissipation, optimizes the power supply rejection ratio (PSRR) (e.g., increases the PSRR), and reduces noise (e.g., mitigates or eliminates noise during communication between the sensor(s) and ECU). As described herein, the voltage supplied to a sensor is a key factor to achieve accurate communication between sensors (slaves) and the transceiver (master).

Example embodiments define an optimized shape for the voltage waveform profile during forward communication (e.g., during communication of a message from the ECU to the sensor(s)) which in turn results in low radiated and conducted emissions. Example embodiments provide a digital control loop that limits the sensor supply voltage (e.g., in case of high input voltage) to a safe value for correct operation of the sensor. Example embodiments implement a soft-start sensor power supply which reduces current spike during transceiver switch on and avoids voltage overshoot.

As described herein, the digital control loop in accordance with example embodiments is configured for providing a regulated supply voltage to a sensor (e.g., speed sensor, brake sensor, air bag sensor, etc. of a vehicle) and also communicate with the sensor (e.g., transmit messages to the sensor). A transceiver (e.g., embodying a digital control loop) in accordance with example embodiments may generate a stable voltage for a remote sensor starting from an input voltage source.

FIG. 1 provides an example block diagram of a digital control loop 100 for sensor supply in accordance with at least one embodiment. The digital control loop 100 may be embodied within a transceiver configured to function as a sensor interface. In various embodiments, the digital control loop 100 is configured to supply regulated voltage to one or more sensors (e.g., external sensors with respect to the digital control loop 100) and modulate the regulated voltage during forward communication for supply to the one or more sensors. In some embodiments, the digital control loop 100 is implemented as an integrated circuit (IC). As described herein, the digital control loop 100 may be configured to provide regulated supply voltage to a sensor (e.g., a sensor external to the digital control loop 100). For example, the sensor may be positioned outside the integrated circuit chip embodying a digital control loop 100. The sensor may be coupled to the digital control loop 100. The sensor may be configured to sink the current when it receives the supply voltage and modulate the current through the line (e.g., wire) connected to the sensor.

As described herein, the digital control loop 100 may be configured to modulate the supply voltage and supply the modulated voltage to the sensor to communicate one or more messages to the sensor. In various embodiments, to transmit a message to a sensor, the digital control loop 100 modulates the input voltage with specific patterns (e.g., $V_{HIGH}$ to $V_{LOW}$) that are recognizable by the sensor. In this regard, the digital control loop 100 may be configured to generate, from an input voltage, a fixed voltage to supply to one or more sensors (e.g., when a message is not being transmitted) and also configured to modulate the voltage to communicate a message to the sensor (e.g., forward communication).

As shown in FIG. 1, the example digital control loop 100 comprises an input node 102, analog-to-digital module 104, voltage drop module 106, digital-to-analog module 108, voltage regulator module 110, and output node 114. In various embodiments, the input node 102 is configured to receive an input voltage 101. The input voltage 101 may comprise analog input voltage. The input voltage 101 may be received from an input voltage source (Vsup) such as, for example, a vehicle battery. The input source may be configured to provide input voltage to the digital control loop 100 or otherwise ECU associated with the digital control loop 100. The input voltage source may have different values in different applications. By way of example, the input voltage source may supply a pre-regulated voltage shared with other functions. As another non-limiting example, the input voltage source may supply voltage directly from the battery line. For example, the input node may be connected to the vehicle battery or other input voltage source.

In various embodiments, the analog-to-digital module 104 is configured to receive the input voltage 101 via the input node 102 and generate a digital signal 105 (e.g., digital code output) corresponding to the input voltage 101. In various embodiments, the voltage drop module 106 is configured to perform one or more digital processing operations with respect to the digital signal 105 output of the analog-to-digital module 104 to generate a reference voltage control signal 107 (e.g., digital code output). For example, the reference voltage control signal may comprise digital code output corresponding to a reference voltage for regulating the voltage supplied to one or more sensors by the digital control loop 100. The reference voltage control signal 107 may comprise digital code output corresponding to a fixed reference voltage (e.g., when a message is not being communicated to the sensor(s). The reference voltage control signal 107 may comprise digital code output corresponding to a voltage waveform (e.g., voltage pulses) when a message is being communicated to the sensor(s).

In various embodiments, the digital-to-analog module 108 is configured to receive the reference voltage control signal 107 output of the voltage drop module 106 and generate a reference voltage 109 based on the reference voltage control signal 107 output of the voltage drop module 106. In various embodiments, the voltage level/amplitude of the reference voltage 109 varies in a manner which generally corresponds to the input voltage 101. In various embodiments, the voltage regulator module 110 is configured to receive the reference voltage 109 and a sensed voltage 111 at output node 114. In various embodiments, the voltage regulator module 110 is configured to sense the voltage (e.g., sensed voltage 111) at the output node 114. In various embodiments, the voltage regulator module 110 is configured to compare the reference voltage 109 to the sensed voltage 111. In various embodiments, responsive to comparing the reference voltage 109 to the sensed voltage 111, the voltage regulator module 110 generates or otherwise controls an output voltage for supplying a sensor coupled to the output node 114. The output voltage may comprise a regulated voltage having a fixed value (e.g., fixed DC voltage). Alternatively or additionally, the output voltage may comprise voltage pulses (e.g., modulated voltage).

Figure 2:
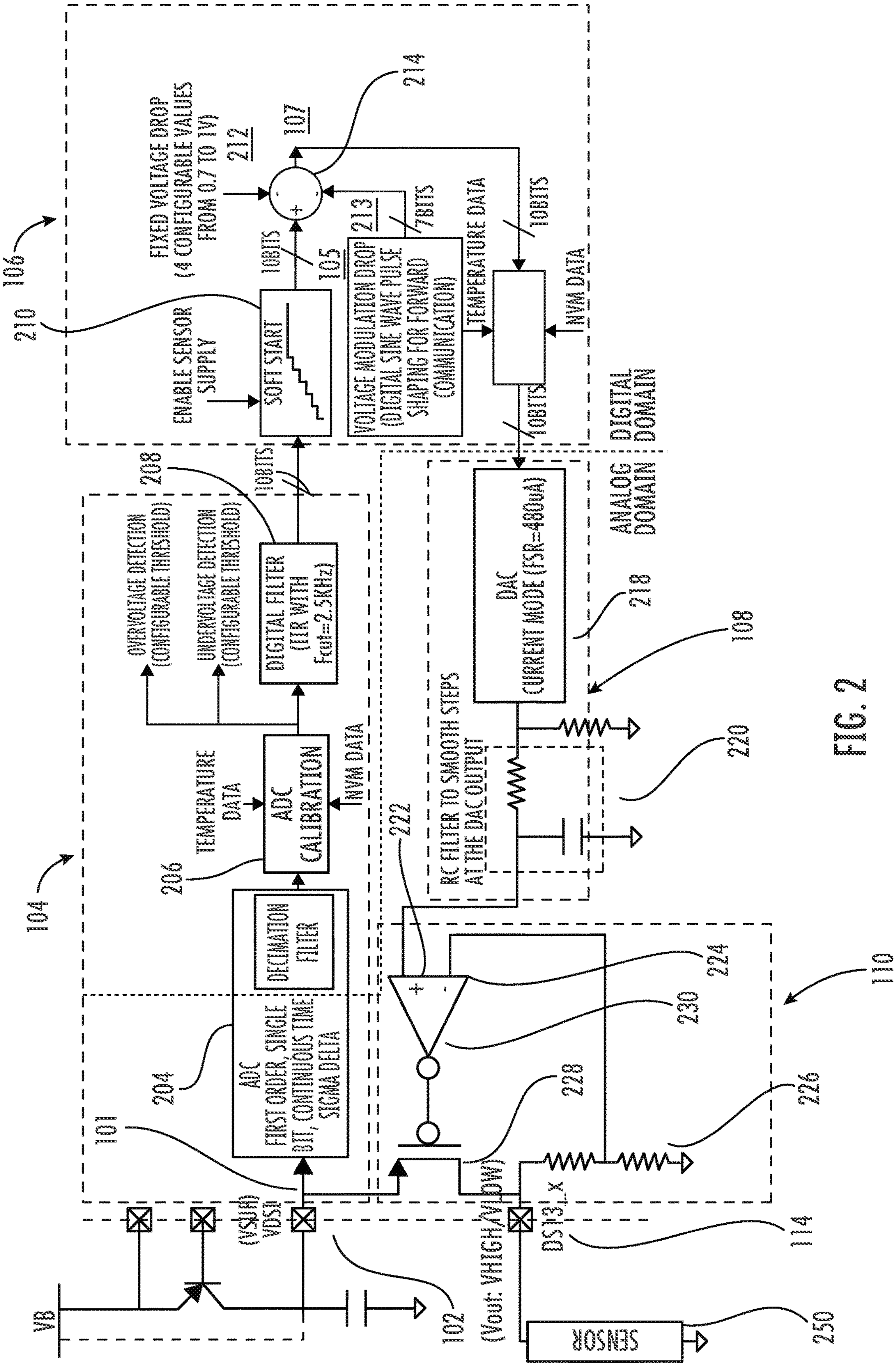
FIG. 2 provides an example block diagram of a digital control loop showing various components thereof in accordance with at least one embodiment.

FIG. 2 provides an example block diagram of a digital control loop 100 showing various components thereof in accordance with at least one embodiment. In various embodiments, the digital control loop 100 may be implemented as, comprise, or otherwise embody an integrated circuit. In various embodiments, one or more sensors may be connected to the digital control loop 100. For example, one or more sensors may be connected to a transceiver integrated circuit embodying a digital control loop 100. In some embodiments, a sensor 250 may be connected to the transceiver integrated circuit through a single line. For example, in some embodiments, the sensor 250 and the transceiver integrated circuit may share a ground. In some embodiments, the sensor ground line is not shared with the transceiver integrated circuit, such that there is one wire between the transceiver integrated circuit and the sensor 250.

As shown in FIG. 2, the analog-to-digital module 104 includes an analog-to-digital converter (ADC) 204. The ADC 204 may comprise a general ADC, a sigma-delta ADC, and/or the like. In one example embodiment, the ADC comprises a first order sigma-delta ADC. For example, the ADC 204 may comprise a first order, single bit continuous time sigma-delta ADC in some embodiments. In various embodiments, the ADC 204 is configured to receive the input voltage 101 supplied by an input voltage source. In some embodiments, receiving the input voltage 101 comprises monitoring and/or reading the input voltage 101 at an input node 102. For example, the ADC 204 may be configured to monitor and/or read the input voltage 101 at the input node 102 (e.g., the voltage on an input supply pin). The input node 102 may be connected directly to an input supply source (e.g., battery, etc.). For example, in the illustrated embodiment of FIG. 2, the transceiver integrated circuit may be directly supplied by a battery (VB). In various embodiments, the input voltage 101 is an analog input voltage. In various embodiments, the ADC 204 is configured to generate a digital signal 105 corresponding to the analog input voltage.

In some embodiments and as shown in FIG. 2, the analog-to-digital module 104 includes an ADC calibration circuitry 206. The ADC calibration circuitry 206 may be configured to perform ADC calibration with respect to the ADC 204 and/or ADC 204 output to improve the accuracy on the voltage sensed at the input node 102 (e.g., sensed through the input supply pin). In various embodiments the ADC calibration circuitry 206 performs the ADC calibration based on temperature data and/or other data stored in memory (e.g., data stored in non-volatile memory (NVM)). Alternatively or additionally, in some embodiments, the analog-to-digital module 104 includes a digital filter unit 208. The digital filter unit 208 may be configured to apply one or more digital filters to the output of the ADC 204 or the output of the ADC calibration circuitry 206 (where implemented) to mitigate or otherwise prevent instability and/or oscillation which can impact downstream processes (e.g., voltage regulation, voltage modulation, and/or the like) associated with the digital control loop 100. By applying the one or more digital filters as described herein, various embodiments of the present disclosure improve the power supply rejection ratio (PSRR) which in turn enables a stable sensor supply and reduces noise. For example, in various embodiments, if the external supply (e.g., input voltage) changes (e.g., increases or decreases) during operation of the transceiver integrated circuit, the digital control loop 100 is configured to track the changes and maintain initial performances. In one example embodiment, the one or more digital filters comprise a digital low pass filter.

As shown in FIG. 2, the digital control loop 100 includes moving from analog voltage information to digital information. For example, as depicted in FIG. 2, the digital control loop 100 may comprise an analog domain (e.g., analog portion) and a digital domain (e.g., digital portion), where the digital control loop 100 may include moving from the analog domain to the digital domain and then back to the analog domain. For example, the digital control loop 100 may include moving from analog voltage information to digital voltage information and then back to analog voltage information. At least a portion of the analog-to-digital module 104 and the voltage drop module 106 may be associated with the digital domain.

In various embodiments, the voltage drop module 106 includes a subtractor 214. In various embodiments, the voltage drop module 106 is configured to perform digital processing on the digital signal 105 output (e.g., digital code) of the analog-to-digital module 104 to output a reference voltage control signal 107 (e.g., in digital code form). In various embodiments, the subtractor 214 implements a fixed voltage drop and/or modulation voltage drop logic to generate the reference voltage control signal 107.

As described above, the digital signal 105 output may correspond to or otherwise represent a digital equivalent of the analog input voltage 101. The reference voltage control signal 107 may comprise digital code output corresponding to a reference voltage generated via the digital-to-analog module 108 of the digital control loop 100 based on the reference voltage control signal 107. The reference voltage may be configured for regulating and/or modulating the voltage supplied to one or more sensors by the digital control loop 100. For example, the reference voltage control signal 107 may comprise digital code output corresponding to a fixed reference voltage (e.g., when a message is not being communicated to the sensor(s) or may comprise digital code output corresponding to a voltage waveform (e.g., voltage pulses) when a message is being communicated to the sensor(s).

The subtractor 214 may be configured to receive the digital signal 105 and a fixed voltage drop 212. In various embodiments, the fixed voltage drop 212 is a fixed value configured to be applied to the digital signal 105 output of the analog-to-digital module 104. In various embodiments, the fixed voltage drop 212 is configurable. For example, the subtractor 214 may be configured to receive the digital signal 105 output from the analog-to-digital module 104 as well as a configurable fixed voltage drop 212. In various embodiments, the configurable fixed voltage drop 212 is applied to the digital signal 105 output of the analog-to-digital module 104 (e.g., after ADC calibration and digital filtering in some embodiments) at the voltage drop module 106 to regulate the input voltage for supply to the sensor 250 via the digital-to-analog module 108 and/or voltage regulator module 110 of the digital control loop 100. In various embodiments, applying the configurable fixed voltage drop 212 to the digital signal 105 comprises subtracting the fixed voltage drop 212 from the digital signal 105 using the subtractor 214. In this regard, the supply voltage for the sensor 250 may be dynamically generated by logic using supply conversion data, where the supply voltage may correspond to a reference voltage generated at the digital-to-analog module 108 of the digital control loop 100 based on the reference voltage control signal 107. For example, the supply voltage for the sensor 250 may comprise amplified reference voltage. For example, the reference voltage output may be amplified by a voltage divider ratio to output the supply voltage for the sensor 250. The target supply voltage, for example, may correspond to the digital equivalent of the input voltage minus the fixed voltage drop (e.g., input voltage-fixed voltage drop). In this regard, in various embodiments, the voltage drop between the input node 102 and the regulated voltage supplied to the sensor 250 can be determined digitally. For example, a user can select a fixed voltage drop value that meets the user's desired supply voltage for the sensor 250. In some examples, the maximum voltage drop may be selected by default. By way of a non-limiting example, the maximum voltage drop may, for example, be 1V and may be selected by default. In such non-limiting example, a user may, for example, select a smaller drop based on external sensor configuration to further decrease the power dissipation (e.g., reduced based on external sensor current consumption).

In various embodiments, and as shown in FIG. 2, in addition to the fixed voltage drop 212, a modulation voltage drop 213 may be applied at the voltage drop module 106 to modulate the regulated voltage for supply to the sensor 250 via the digital-to-analog module 108 and/or voltage regulator module 110 of the digital control loop 100. For example, the subtractor 214 may be configured to receive as input, the digital signal 105 output, a fixed voltage drop 212, and a modulation voltage drop 213. The subtractor 214 may perform a subtraction operation that comprises subtracting the fixed voltage drop 212 and the modulation voltage drop 213 from the digital signal 105 to generate a reference voltage control signal 107 that comprises digital code output corresponding to a voltage waveform generated based on the reference voltage control signal 107. For example, digital voltage pulses may be generated based on applying the modulation voltage drop 213 at the voltage drop module 106. The digital voltage pulses, for example, may comprise digital sine wave pulses. The digital voltage pulses may be leveraged at an analog loop portion of the digital control loop 100 to generate a voltage waveform having a pattern recognizable by the sensor 250 and configured for communicating a message to the sensor 250. In various embodiments, the voltage drop module 106 is configured to shape the digital voltage pulses (e.g., for forward communication). By way of example, as illustrated in FIG. 2, a subtraction of 7 bits may be applied to the 10 bits of the voltage reading of the input voltage to generate a reference voltage control waveform of desired shape. In some embodiments, the voltage drop module 106 includes or otherwise implements a soft-start 210. For example, the voltage drop module 106 may implement a soft-start sensor power supply which reduces current spike during transceiver switch on and avoid voltage overshoot.

The digital-to-analog module 108 may be associated with the analog domain of the digital control loop 100. The digital-to-analog module 108 includes a digital-to-analog converter (DAC) 218 configured to generate a reference voltage corresponding to the supply voltage. For example, the DAC 218 may be configured to process the reference voltage control signal 107 to generate the reference voltage. In some embodiments, the output of the DAC 218 is amplified by a voltage divider ratio, by the regulation portion (e.g., at voltage regulator module 110), to the sensor output. For example, the DAC 218 may be configured to output a reference voltage (e.g., analog reference voltage) which may be amplified by the voltage divider ratio. The DAC 218 may be configured to receive the reference voltage control signal 107 (e.g., in digital code form) from the subtractor 214 implementing the fixed voltage drop and/or modulation voltage drop logic and generate the reference voltage. For example, the DAC 218 may generate the reference voltage using input (e.g., 10 bits or the like) received from the subtractor 214. In some embodiments, DAC calibration may be performed with respect to the output of the subtractor 214 prior to providing the output of the subtractor 214 as input to the DAC 218. In some embodiments, the DAC calibration is performed based on temperature data and/or other data in a NVM.

The DAC 218 may generate the reference voltage for comparison with the sensed voltage (e.g., sensed supply voltage) at the output node 114. In this regard, the digital voltage conversion using the analog-to-digital module may be used to drive the DAC 218 configured for generating the reference voltage for the voltage regulator module 110. The DAC 218 may be configured to generate a reference voltage having a fixed value (e.g., fixed DC value) responsive to receiving a reference voltage control signal 107 comprising a fixed voltage value. The DAC 218 may be configured to generate a reference voltage comprising a voltage waveform responsive to receiving a reference voltage control signal 107 comprising digital voltage pulses. In some embodiments, an RC filter 220 is coupled to the DAC 218 to smoothen any sharp transition in the shape of the voltage waveform generated via the DAC. For example, the digital-to-analog module 108 may include the RC filter 220 configured to filter the output of the DAC. The RC filter may comprise one or more resistors and/or one or more capacitors.

By implementing a fully digital implementation of reference voltage comprising a fixed voltage during no message transmission (e.g. $V_{HIGH}$) and reference voltage comprising a voltage waveform during message transmission to a sensor (e.g., transitions $V_{HIGH}$ to $V_{LOW}$ and $V_{LOW}$ to $V_{HIGH}$), embodiments of the present disclosure define the best shape of the voltage profile during forward communication, which in turn results in low radiated and conducted emissions.

The voltage regulator module 110 may be associated with the analog domain of the digital control loop 100. In various embodiments, the voltage regulator module 110 includes a power transistor 228, a differential amplifier 230, and a voltage divider 226 that collectively define a voltage regulator. The voltage regulator may correspond to or otherwise comprise a linear regulator or other voltage regulators. In various embodiments, the differential amplifier is configured to compare the sensed voltage (e.g., voltage at the output node 114) to the reference voltage to provide a stable supply voltage for the sensor. By providing a stable supply voltage for the sensor, embodiments of the present disclosure optimize the performance of the transceiver. For example, the performance of a transceiver with respect to various performance parameters of the transceiver may be based at least in part on the supply voltage for the sensors.

In various embodiments, the digital control loop 100 is configured to ensure that the supply voltage is lower than the input voltage multiplied by the transceiver RON, which keeps the power transistor 228 in saturation region in order to generate a higher PSRR. Alternatively or additionally, in various embodiments, the digital control loop 100 is configured to optimize power dissipation. For example, internal power dissipation may increase with input voltage (VSUP) to output voltage ($V_{HIGH}$) drop. In this regard, the performance of a transceiver with respect to the PSRR may be based at least in part on the supply voltage to the sensor, where example embodiments of the present disclosure are configured to control the supply voltage and in turn improve the PSRR, power dissipation, and other performance parameters associated with a transceiver. Various embodiments provide the stable supply voltage or otherwise optimizes the supply voltage using the information from an existing ADC already present in the supply line.

The differential amplifier 230 may include a first input terminal configured to receive the reference voltage and a second input terminal configured to receive the sensed voltage. As shown in FIG. 2, the differential amplifier 230 includes a non-inverting input 222 configured to receive the reference voltage and an inverting input 224 configured to receive the sensed voltage. A gate of the power transistor 228 (e.g., MOSFET, or the like) may be coupled to the output terminal of the differential amplifier 230. The source terminal of the power transistor 228 may be coupled indirectly or directly to the input node 102, and the drain terminal of the power transistor 228 may be coupled to the output node 114. For example, in some embodiments, the source terminal of the power transistor 228 may be coupled indirectly to the input node 102 via another transistor (e.g., MOSFET, or the like). In various embodiments, the sensed voltage is sensed through a voltage divider 226 coupled to the output node 114 and a ground. As shown in FIG. 2, The voltage divider 226 is coupled to the power transistor 228 and the second input terminal of the differential amplifier 230. In some embodiments, the differential amplifier 230 is configured to output a control voltage (e.g., error) based on the referenced voltage and the sensed voltage. The control voltage may be configured to drive the power transistor 228 to supply the voltage to the sensor and/or control the supply voltage to the sensor. In some embodiments, the voltage divider 226 is configured to scale down the voltage at the output node to a level equal to the reference voltage. For example, the power transistor 228 may drive the voltage divider 226 to scale down the voltage at the output node to a level equal to the reference voltage.

In some embodiments, a second regulator may be connected to the input voltage source (e.g., battery) to generate a lower voltage relative to the input voltage source. For example, the second regulator may be a pre-regulator that feeds the transceiver integrated circuit with a certain DC voltage. In some examples, the second regulator may comprise a bipolar and a capacitor.

Figures 3A, 3B:
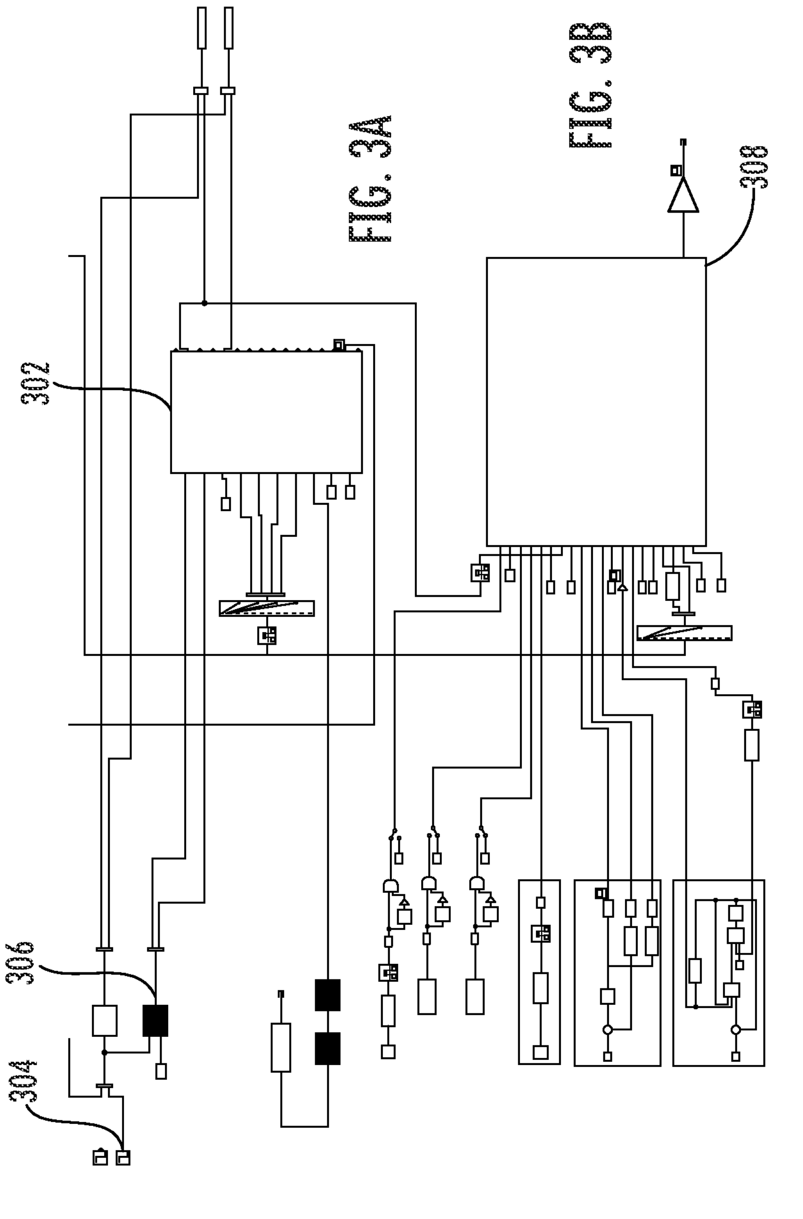
FIGS. 3*a-b* provide digital block environments in which an example digital control loop may be implemented in accordance to at least on example embodiment.

FIGS. 3*a*-*b* provide digital block environments in which a digital control loop 100 may be implemented in accordance to at least on example embodiment. Specifically, FIG. 3*a* depicts a digital block 302 for ADC conversion and filtering. FIG. 3*a* may represent a particular implementation of an analog-to-digital module 104. FIG. 3*a* further shows an input voltage 304 (e.g., VDSI input voltage) and model 306 of analog portion of the ADC. FIG. 3*b* depicts a digital block 308 for control of the DAC input code (e.g., reference voltage control signal). For example, the digital block 308 for control of the DAC input code may implement or otherwise embody the soft-start, voltage drop, and/or sine wave pulse generation associated with the voltage drop module 106. As illustrated in FIGS. 3*a*-3*b*, example embodiments of the present disclosure may be embodied by one or more integrated chips. For examples, one or more modules of the digital control loop 100 may be embodied by one or more integrated chips.

Figure 4A:
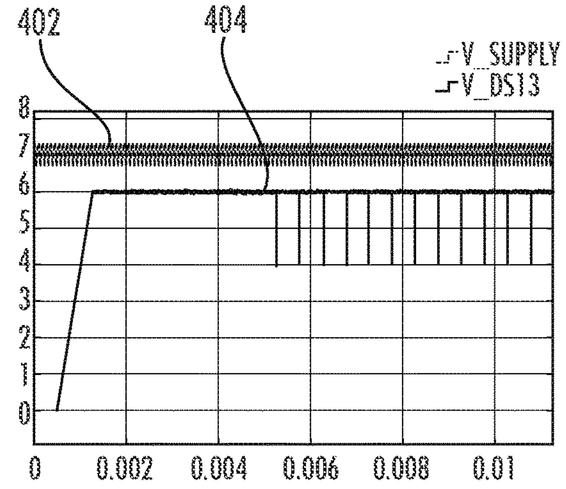
FIGS. 4*a-c* provide operational examples of portions of a voltage waveform in accordance with at least one embodiment.
Figure 4B:
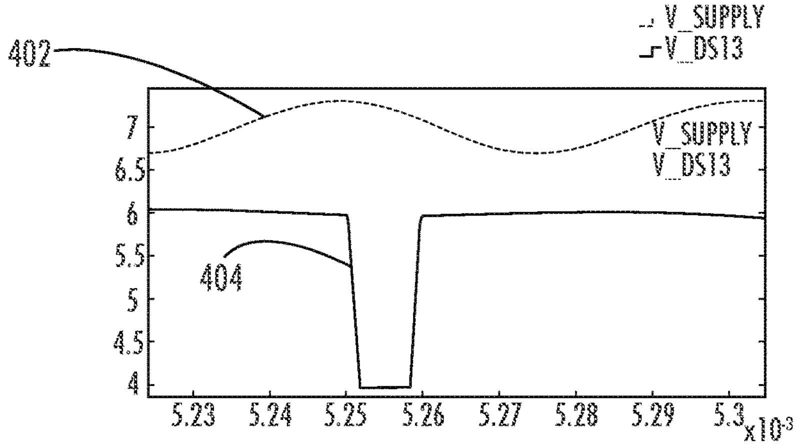
Figure 4C:
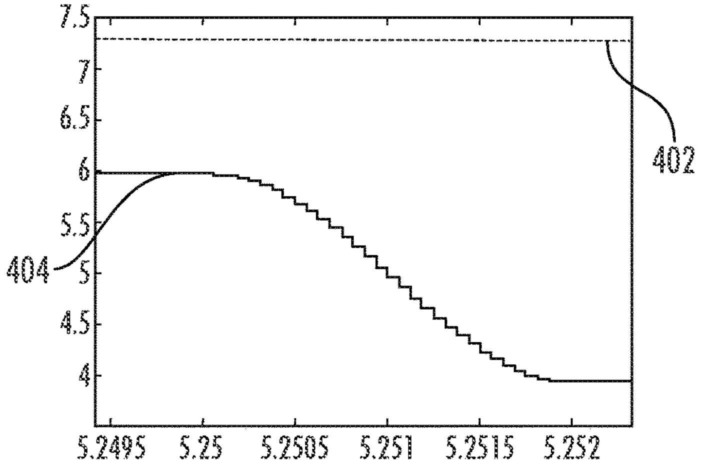

FIGS. 4*a*-*c* provide operational examples of portions of a voltage waveform in accordance with at least one embodiment. Specifically, FIG. 4*a* provides a portion of a voltage waveform 404 output of a voltage drop module 106 of a digital control loop 100. FIG. 4*b* and FIG. 4*c* each provide a close-up view of a portion of the voltage waveform 404 depicted in FIG. 4*a*. As described herein, the voltage drop module 106 of the digital control loop 100 may be leveraged to generate a voltage waveform 404 based on the input voltage 402. As described herein, the voltage drop module 106 may be configured to apply a voltage drop and/or a modulation voltage drop to a digital signal corresponding to the input voltage 402 to generate a voltage waveform 404 with specific patterns (e.g., $V_{HIGH}$ to $V_{LOW}$) that are recognizable by the sensor. For example, the voltage waveform 404 may comprise voltage pulses having a pattern recognizable by the sensor and configured for communicating a message to the sensor. The voltage waveform 404 may have a configurable slew rate (e.g., rate of change of voltage per unit time. As describe herein, the voltage drop module 106 may be configured to shape the voltage waveform 404 (e.g., define the shape profile of the voltage waveform 404). As shown in FIG. 4*c*, the digital steps may be smoothed, for example, by an RC filter such as RC filter 220. The RC filter may be configured to smoothen any sharp transition in the shape of the voltage pulse generated by the DAC.

Some embodiments of the present disclosure optimize the output voltage ($V_{HIGH}$) using the information from and ADC already present on the supply line for diagnosis purpose. The fully digital regulated reference of example embodiments of the present disclosure allows for less complex implementation with small area impact and test time. Additionally, the fully digital implementation of reference voltage during no transmission ($V_{HIGH}$) and modulated reference voltage during transmission to sensors (transitions $V_{HIGH}$ to $V_{LOW}$ and $V_{LOW}$ to $V_{HIGH}$) in example embodiments of the present disclosure enable optimized shape of the voltage profile to be defined during the forward communication, which results in low radiated and conducted emissions. By implementing the control in digital form, embodiments of the present disclosure reduce the area occupied and provide higher testing efficiency.

Example processes of the disclosure will now be discussed. It will be appreciated that each of the flowcharts depicts an example computer-implemented process that is performable by one or more of the apparatuses, systems, devices, and/or computer program products described herein, for example utilizing one or more of the specially configured components thereof.

Although the example processes depict a particular sequence of operations, the sequence may be altered without departing from the scope of the present disclosure. For example, some of the operations depicted may be performed in parallel or in a different sequence that does not materially affect the function of the processes.

The blocks indicate operations of each process. Such operations may be performed in any of a number of ways, including, without limitation, in the order and manner as depicted and described herein. In some embodiments, one or more blocks of any of the processes described herein occur in-between one or more blocks of another process, before one or more blocks of another process, in parallel with one or more blocks of another process, and/or as a sub-process of a second process. Additionally or alternatively, any of the processes in various embodiments include some or all operational steps described and/or depicted, including one or more optional blocks in some embodiments. With regard to the flowcharts illustrated herein, one or more of the depicted block(s) in some embodiments is/are optional in some, or all, embodiments of the disclosure. Optional blocks are depicted with broken (or “dashed”) lines. Similarly, it should be appreciated that one or more of the operations of each flowchart may be combinable, replaceable, and/or otherwise altered as described herein.

Figure 5:
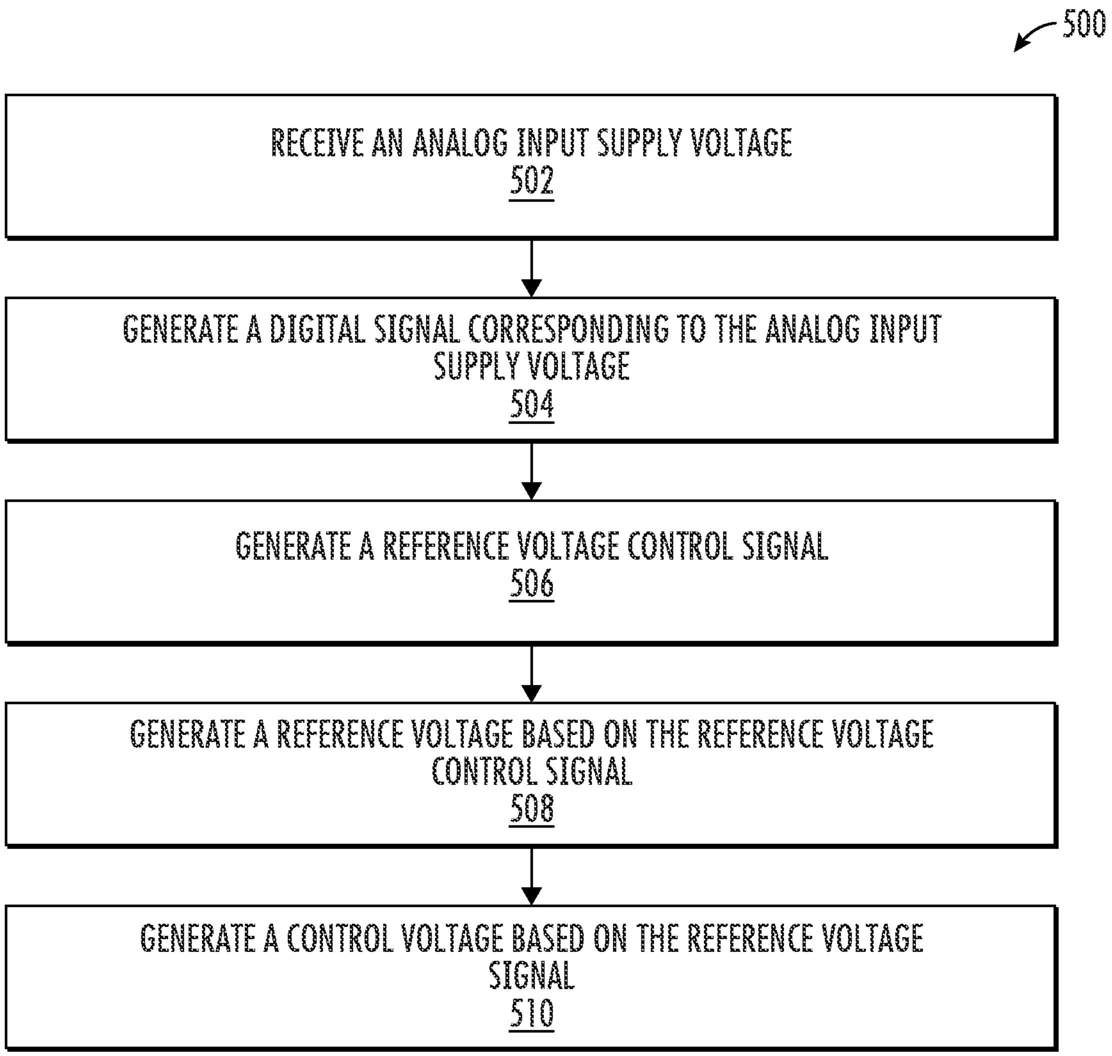
FIG. 5 provides a flow chart depicting operations of an example process for controlling supply voltage for a sensor in accordance with at least on embodiment.

FIG. 5 illustrates a flow chart depicting example operations of an example process for controlling the supply voltage for a sensor in accordance with at least one example embodiment. Specifically FIG. 5 depicts an example process 500 configured for regulating the voltage supply for a sensor and modulating the voltage supply for transmitting a message to the sensor. In some embodiments, the process 500 is performed by one or more specially-configured computing devices, such as an apparatus embodying the digital control loop 100 alone or in communication with one or more other component(s), device(s), system(s), and/or the like. In some embodiments, the apparatus comprises the digital control loop 100. In some embodiments, the apparatus comprises a transceiver embodying the digital control loop 100. In some embodiments, the apparatus is in communication with one or more external apparatus(es), system(s), device(s), and/or the like, to perform one or more of the operations as depicted and described. For example, the apparatus in some embodiments is in communication with a controller (e.g., ECU), and/or the like, to perform one or more of the operations as depicted and described.

Although the example process 500 depicts a particular sequence of operations, the sequence may be altered without departing from the scope of the present disclosure. For example, some of the operations depicted may be performed in parallel or in a different sequence that does not materially affect the function of the process 500. In other examples, different components of an example device or system that implements the process 500 may perform functions at substantially the same time or in a specific sequence.

According to some examples, the method includes receiving an analog input voltage at block 502. In some embodiments, the analog input voltage may be received from a voltage source associated with a vehicle, such as an external circuitry inside the vehicle. For example, the apparatus may receive the analog input voltage from an input voltage source such as, for example, a battery (e.g., vehicle battery). The input voltage source may have different values in different applications. By way of example, the input voltage source may supply a pre-regulated voltage shared with other functions. As another non-limiting example, the input voltage source may supply voltage directly from the battery line. For example, the input node may be connected to the vehicle battery or other input voltage source.

According to some examples, the method includes generating a digital signal corresponding to the analog input voltage at block 504. The apparatus may leverage an ADC to generate the digital signal. In some embodiments, the apparatus may leverage the ADC to monitor and/or read the input voltage at an input node coupled to the input voltage source and the ADC. The input node may be connected directly to an input supply source (e.g., battery, etc.). For example, in the apparatus can be directly supplied by a battery. The input voltage 101 may be analog voltage. In some embodiments, the apparatus leverages one or more of ADC calibration or digital filtering to optimize the digital signal. The apparatus may perform ADC calibration with respect to the output of the ADC to improve the accuracy on the voltage sensed at the input node. Alternatively or additionally, in some embodiments, the apparatus may apply one or more digital filters (e.g., digital low pass filter, and/or the like) to the output of the ADC (e.g., after ADC calibration) to mitigate or otherwise prevent instability and/or oscillation which can impact regulation and/or modulation of the voltage supplied to the sensor.

According to some examples, the method includes generating a reference voltage control signal at block 506. The apparatus may be configured to generate the reference voltage control signal based on the applying one or more of a fixed voltage drop or a modulation voltage drop to the digital signal output (e.g., from block 504). In various embodiments, the fixed voltage drop is a configurable value. In various embodiments, the fixed voltage drop is applied to the digital signal to regulate the voltage for supply to the sensor via an analog portion. For example, the supply voltage for a sensor may be dynamically generated by logic using supply conversion data. For example, the supply voltage for the sensor may be generated based at least in part on subtracting the fixed voltage drop from the digital signal corresponding to the input voltage, and amplifying the output based on a voltage divider ratio.

In various embodiments, the apparatus may apply, in addition to the fixed voltage drop, a modulation voltage drop to the digital signal to generate a reference voltage control signal comprising digital voltage pulses. In some embodiments, the digital voltage pulses comprise a digital sine wave pulse. The apparatus may be configured to shape the digital voltage pulses for forward communication (e.g., define the shape profile). By way of example, the digital signal output may have a resolution of 10 bits. In some embodiments, the modulation voltage drop may have a resolution of 7 bits. In some embodiments, the reference voltage control signal may have a resolution of 10 bits. It would be appreciated that the digital signal, modulation voltage drop and/or reference voltage control signal may have different resolution in other embodiments. In some embodiments, the apparatus may perform a DAC calibration with respect to the to the reference voltage control signal. In some embodiments, the DAC calibration is performed based on temperature data and/or NVM data.

According to some examples, the method includes generating a reference voltage at block 508. The apparatus may include a DAC configured to generate, based on the reference voltage control signal, a reference voltage corresponding to the desired supply voltage. The reference voltage may comprise a fixed voltage (e.g., when no communication) or a voltage waveform (e.g., for forward communication). In some embodiments, the reference voltage is amplified (e.g., based on a voltage divider ratio). In some embodiments, the apparatus includes an RC filter 220 configured to smoothen any sharp transition in the shape of the voltage waveform generated by the DAC. The RC filter may comprise one or more resistors and/or one or more capacitors.

According to some examples, the method includes generating a control voltage based on the reference voltage signal and the sensed voltage at block 510. The apparatus may include a voltage regulator. The voltage regulator, for example, may comprise a linear voltage regulator, and/or the like. In some embodiments, the voltage regulator may include a power transistor, a differential amplifier, and a voltage divider. In various embodiments, the apparatus, using the differential amplifier, compares a sensed voltage at an output node coupled to sensor and the voltage divider to generate the control voltage (e.g., error). The voltage divider may be configured to sense the voltage at the output node. In various embodiments, the control voltage is configured to drive the power transistor to supply voltage to the sensor and/or control the supply voltage to the sensor. The power transistor may drive the voltage divider to scale down the supply voltage based on the control voltage.

CONCLUSION

Many modifications and other embodiments of the disclosure set forth herein will come to mind to one skilled in the art to which this disclosure pertains having the benefit of the teachings presented in the foregoing description and the associated drawings. Therefore, it is to be understood that the embodiments are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single product or packaged into multiple products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

Further, while this detailed description has set forth some embodiments of the present disclosure, the appended claims may cover other embodiments of the present disclosure which differ from the described embodiments according to various modifications and improvements. For example, in some embodiments, the voltage regulator may comprise a linear voltage regulator or other types of voltage regulators. As another example, in some embodiments, the fixed voltage drop may not be configurable. As yet another example, in some embodiments, ADC calibration and/or DAC calibration may not be performed.

Further, within the appended claims, unless the specific terms "means for" or "step for" is used within a given claim, it is not intended that the claim be interpreted under 35 U.S.C. § 112, paragraph (f).

The invention claimed is:

1. A digital control loop for sensor supply comprising:

an analog-to-digital module configured to receive an analog input voltage from a battery, and generate a digital signal corresponding to the analog input voltage, wherein the analog input voltage comprises a voltage supplied by the battery;

a voltage drop module coupled to the analog-to-digital module, the voltage drop module configured to receive one or more of a fixed voltage drop or a modulation voltage drop, and generate a reference voltage control signal based on the digital signal and one or more of the fixed voltage drop or the modulation voltage drop, wherein the voltage drop module is configured to generate the reference voltage control signal by subtracting the fixed voltage drop from the digital signal and by applying the modulation voltage drop to the digital signal during a forward communication configured to transmit a message to at least one sensor;

a digital-to-analog module coupled to the voltage drop module, the digital-to-analog module configured to generate a reference voltage based on the reference voltage control signal; and a voltage regulator module coupled to the digital-to-analog module and the at least one sensor, the voltage regulator module configured to compare the reference voltage to a sensed voltage at an output node coupled to the at least one sensor, and control a supply voltage for the at least one sensor based on the comparison of the reference voltage to the sensed voltage.

2. The digital control loop of claim 1, wherein the reference voltage control signal comprises a voltage waveform, wherein the voltage drop module is further configured to define a shape profile of the voltage waveform.

3. The digital control loop of claim 1, wherein the analog-to-digital module comprises:

an analog-to-digital converter (ADC) configured to process the analog input voltage; and a digital filter configured to filter an output of the ADC to generate the digital signal corresponding to the analog input voltage.

4. The digital control loop of claim 3, wherein the digital filter comprises a low pass filter.

5. The digital control loop of claim 1, wherein the digital-to-analog module comprises:

a digital-to-analog converter (DAC) configured to process the reference voltage control signal to generate the reference voltage.

6. The digital control loop of claim 1, wherein the voltage regulator module comprises:

a differential amplifier having a first input terminal configured to receive the reference voltage and a second input terminal configured to receive the sensed voltage;

a power transistor having a gate terminal coupled to an output terminal of the differential amplifier; and a voltage divider coupled to the power transistor and the second input terminal of the differential amplifier.

7. The digital control loop of claim 6, wherein the voltage divider is configured to generate the sensed voltage.

8. The digital control loop of claim 6, wherein a drain terminal of the power transistor is coupled to the output node and the voltage divider.

9. The digital control loop of claim 8, wherein the voltage divider is configured to scale down a voltage at the output node to a level equal to the reference voltage.

10. The digital control loop of claim 1, wherein the analog input voltage is received from a voltage source associated with a vehicle.

11. The digital control loop of claim 1, wherein the fixed voltage drop is configurable.

12. A transceiver comprising:

a digital control loop for sensor supply comprising:

an analog-to-digital module configured to receive an analog input voltage from a battery, and generate a digital signal corresponding to the analog input voltage, wherein the analog input voltage comprises a voltage supplied by the battery;

a voltage drop module coupled to the analog-to-digital module, the voltage drop module configured to receive one or more of a fixed voltage drop or a modulation voltage drop, and generate a reference voltage control signal based on the digital signal and one or more of the fixed voltage drop or the modulation voltage drop, wherein the voltage drop module is configured to generate the reference voltage control signal by subtracting the fixed voltage drop from the digital signal and by applying the modulation voltage drop to the digital signal during a forward communication configured to transmit a message to at least one sensor;

a digital-to-analog module coupled to the voltage drop module, the digital-to-analog module configured to generate a reference voltage based on the reference voltage control signal; and a voltage regulator module coupled to the digital-to-analog module and the at least one sensor, the voltage regulator module configured to compare the reference voltage to a sensed voltage at an output node coupled to the at least one sensor, and control a supply voltage for the at least one sensor based on the comparison of the reference voltage to the sensed voltage.

13. The transceiver of claim 12, wherein the voltage drop module of the digital control loop is configured to generate the reference voltage control signal by subtracting the fixed voltage drop from the digital signal corresponding to the analog input voltage, wherein the reference voltage control signal has a fixed value.

14. The transceiver of claim 12, wherein the analog-to-digital module of the digital control loop comprises:

an analog-to-digital converter (ADC) configured to process the analog input voltage; and a digital filter configured to filter an output of the ADC to generate the digital signal corresponding to the analog input voltage.

15. The transceiver of claim 14, wherein the digital filter of the digital control loop comprises a low pass filter.

16. A method of controlling a voltage supply for a sensor, the method comprising:

receiving an analog input voltage from a battery, wherein the analog input voltage comprises a voltage supplied by the battery;

generating a digital signal corresponding to the analog input voltage;

generating a reference voltage control signal by applying a fixed voltage drop to the digital signal and by applying a modulation voltage drop to the digital signal during a forward communication configured to transmit a message to the sensor, wherein applying the fixed voltage drop to the digital signal comprises subtracting the fixed voltage drop from the digital signal;

generating, using a digital-to-analog converter and based on the reference voltage control signal, a reference voltage; and generating a control voltage based on comparing the reference voltage to a sensed voltage, wherein the control voltage is configured to control supply voltage for the sensor.

* * * * *